US009087854B1

(12) United States Patent
Ha et al.

(10) Patent No.: US 9,087,854 B1
(45) Date of Patent: Jul. 21, 2015

(54) THERMAL MANAGEMENT FOR HETEROGENEOUSLY INTEGRATED TECHNOLOGY

(71) Applicant: HRL Laboratories, LLC, Malibu, CA (US)

(72) Inventors: Wonill Ha, Thousand Oaks, CA (US); Hasan Sharifi, Agoura Hills, CA (US); Tahir Hussain, Calabasas, CA (US); James Chingwei Li, Simi Valley, CA (US); Pamela R. Patterson, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/158,962

(22) Filed: Jan. 20, 2014

(51) Int. Cl.
*H01L 23/60* (2006.01)
*H01L 29/66* (2006.01)
*H01L 27/06* (2006.01)
*H01L 29/778* (2006.01)

(52) U.S. Cl.
CPC ...... *H01L 29/66431* (2013.01); *H01L 27/0623* (2013.01); *H01L 29/778* (2013.01)

(58) Field of Classification Search
USPC .......... 257/195, 161, 784, 278, 724, E27.016, 257/E27.112; 438/118, 123
See application file for complete search history.

(56) References Cited

U.S. PATENT DOCUMENTS 6,392,859 B1 * 5/2002 Ohshima ....................... 361/100
8,803,206 B1 * 8/2014 Or-Bach et al. ............... 257/278

OTHER PUBLICATIONS

Lau and Yue, "Thermal Management of 3D IC Integration with TSV (Through Silicon Via)", Electronic Components and Technology Conference, 2009. ECTC 2009. 59th. pp. 635-640.
Puttaswamy and Loh, "Thermal analysis of a 3D die-stacked high-performance microprocessor", GLSVLSI 2006 Proceedings of the 16th ACM Great Lakes symposium on VLSI pp. 19-24.
Chang-Chien et al., "3D Wafer-Scale Integration for RF and Digital Applications", ECS Trans. 2008 vol. 16, issue 8, pp. 243-249.
Brunschwiler et al., "Interlayer Cooling Potential in Vertically Integrated Packages," Microsystem Technol. 15(1), 2009, pp. 57-74.
"B. Goplen and S. S. Sapatnekar, "Placement of Thermail Vias in 3-D ICx Using Various Thermal Objectives", IEEE Trans. Computer-Aided Design of Integrated Circuits and Systems, vol. 25(4), Apr. 2006, pp. 692-709".

(Continued)

*Primary Examiner* — Cathy N Lam
(74) *Attorney, Agent, or Firm* — Ladas & Parry

(57) ABSTRACT

A method of three dimensional heterogeneous integration including forming HBT devices on a first substrate, each HBT device having a collector, removing the first substrate, forming first bonding pads on each collector of the heterojunction bipolar transistor devices, forming high electron mobility transistor (HEMT) devices on a first side of a growth substrate, wherein the growth substrate comprises a thermally conductive substrate, such as SiC or diamond, forming second bonding pads on the first side of the growth substrate, aligning and bonding the first bonding pads to the second bonding pads, forming CMOS devices on a Si substrate, bonding the CMOS devices on the Si substrate to a second side of the growth substrate, and forming selectively interconnects between the HBT devices, the HEMT devices, and the CMOS devices by forming vias and first and second level metal interconnects.

26 Claims, 9 Drawing Sheets

(56) References Cited

OTHER PUBLICATIONS

Zimmer, "The Role of High Thermal Conductivity Substrates in Future CMOS Technologies", 2012, pp. 1-28.

"T. Y. Chiang et al., "Effect of Via Separation and Low-k Dielectric Materials on the Thermal Characteristics of Cu Interconnects", Proc. IEEE Int. Electron Devices Meeting Tech. Dig., San Francisco, CA, 2000, pp. 261-264".

* cited by examiner

C3. Spin BCB on 200 mm CMOS, align and BCB bond multi-technology tiles.

D5. Apply dielectric, etch and fill vias, pattern terminal metal (HiC3)

HIT IC stack power and thermal network parameters used to support thermal simulation.

| HIT Stack Tier | Device Technology (power) | Materials & Interface Properties |
|---|---|---|
| Tier 2 | RF GaN (1W/mm) | SiC (400 W/mK) Super-Strate, 25 μm thick GaN (130 W/mK) / AlGaN (60 W/mK) |
| Tier 1 | Mixed Signal GaN HEMT and InP DHBT, ~5 mW/transistor | SiC (400 W/mK) Heat Spreader, 1-5 μm thick Copper (400 W/mK) Thermal Via, 7% area fill, TaN (3.0 W/mK) InP (68 W/mK)/ InGaAs (4.6 W/mK) InP/Metal/SiC (45 W/mK) |
| Base | Si CMOS (50 W/cm²) Base Temp. 70°C | Si (149 W/mK) 500 μm CMOS 0.00056 cm2 K/W |

FIG. 4

THERMAL MANAGEMENT FOR HETEROGENEOUSLY INTEGRATED TECHNOLOGY

CROSS REFERENCE TO RELATED APPLICATIONS

None

STATEMENT REGARDING FEDERAL FUNDING

None

TECHNICAL FIELD

This disclosure relates to thermal management of integrated circuits (ICs), and in particular three dimensional (3D) heterogeneous integration (HI) of diverse technology ICs.

BACKGROUND

There is great interest in three dimensional (3D) heterogeneous integration (HI) technology in the integrated circuit industry, because with high heterogeneous device density in 3D integrated system, complex RF/mixed-signal ICs and systems can be achieved. Inevitably power density of an integrated system can easily exceed that of a conventional system, which can achieve up to an approximate value of 100 W/cm$^2$. As more devices and functionalities are added, the power density increases, which can result in reduced device performance and shortened device lifetimes.

Heterogeneous integration of digital and non-digital devices into compact systems has a wide range of applications, including application in communication, automotive, environmental control, healthcare, security and entertainment. A few examples are phased array radars, high power transceivers, high power digital to analog converters (DACs), analog to digital converters (ADCs), and monolithic microwave integrated circuits (MMICs).

Much of prior art 3D integration effort has been focused on 3D silicon integration with through silicon vias (TSVs). The conventional thermal management approach for this effort is dissipating heat through copper (Cu) filled TSVs, as described in "Thermal Management of 3D IC Integration with TSV (Through Silicon Via)", Electronic Components and Technology Conference, 2009. ECTC 2009. 59th and "Thermal analysis of a 3D die-stacked high-performance microprocessor", GLSVLSI '06 Proceedings of the 16th ACM Great Lakes symposium on VLSI pp 19~24.

The TSV method mainly extracts heat vertically and does not provide horizontal heat spreading. For the case of concentrated local heat generation often seen in heterogeneous integration, this method is not sufficient, because this method will simply transfer heat generated in a local hot spot in one layer to the level above or below resulting in other hot spots. Also for multiple chip stacking integration, chips that are stacked at higher level benefit less from this vertical thermal management solution.

For a bump bonding integration approach, there have been efforts to extract heat through bonding metal pads or metal interconnect lines, as described in "3D wafer-scale integration for RF and digital applications", ECS Trans. 2008 volume 16, issue 8, 243-249. This approach also focuses on heat extraction through interconnect lines vertically and does not provide an adequate solution for local heat generation.

Another approach for cooling using interlayer fluid cooling technology for 3D integrated circuit packaging is described in "Interlayer Cooling Potential in Vertically Integrated Packages," Microsystem Technol. 15(1) (2009) 57-74. This is a good packaging solution to extract heat from multiple stacked layers; however, this approach has increased costs, potential for a leak of cooling fluid, a system volume increase, and a questionable system lifetime.

For CMOS 3D integration, there is a prior art approach of fabricating thermal vias on a Si substrate and filling the vias with higher thermal conductivity metal, such as Cu. Such an approach has been described in "B. Goplen and S. S. Sapatnekar. IEEE Trans. Computer-Aided Design of Integrated Circuits and Systems, Vol. 25(4), pp. 692-709", and "T. Y. Chian et al., Proc. IEEE Int. Electron Devices Meeting Tech. Dig., San Francisco, Calif., 2000, pp. 261-4". Although this approach addresses vertical heat extraction, it does not provide for heat spreading. Also this approach is not applicable to integrated circuits with a silicon carbide (SiC) substrate, because SiC has a thermal conductivity similar to Cu, so a thermal via filled with Cu does not reduce thermal resistance, but rather increases thermal resistance due to the added thermal boundary resistance between Cu and SiC.

There have been efforts directed at growing a diamond layer on the back of a device, such as a Si, InP, or GaN device. The diamond layer acts as a heat spreading layer and has been described by SP3 Diamond. Technologies, for example, in a presentation titled "The Role of High Thermal Conductivity Substrates in Future CMOS Technologies" by Jerry Zimmer. This approach reduces the thermal resistance of native bulk substrates, such as Si, InP, and SiC by lowering junction temperatures. However, this approach is focused on low thermal resistance packaging approach for a single junction device, and maybe not be suitable as a growth platform or an integration platform due to the amorphous nature of this film and the high process temperature of diamond film.

What is needed is improved thermal management for multiple technology device technologies especially in the context of 3D integration. The embodiments of the present disclosure answer these and other needs.

SUMMARY

In a first embodiment disclosed herein, a method of three dimensional heterogeneous integration comprises forming heterojunction bipolar transistor (HBT) devices comprising: forming HBT devices on a first substrate, each HBT device having a collector, removing the first substrate, forming first bonding pads on each collector of the heterojunction bipolar transistor devices, forming high electron mobility transistor (HEMT) devices comprising: forming HEMT devices on a first side of a growth substrate, wherein the growth substrate comprises a thermally conductive substrate, such as SiC or diamond, forming second bonding pads on the first side of the growth substrate, aligning and bonding the first bonding pads to the second bonding pads, forming CMOS devices on a Si substrate, bonding the CMOS devices on the Si substrate to a second side of the growth substrate, and forming selectively interconnects between the HBT devices, the HEMT devices, and the CMOS devices by forming vias and first and second level metal interconnects.

In another embodiment disclosed herein, a three dimensional device with heterogeneous integration of diverse technologies comprises a heat spreader, a plurality of high electron mobility transistor (HEMT) devices formed on a first side of the heat spreader, each HEMT having first interconnects, a plurality of first bonding pads on the first side of the heat spreader, a plurality of HBT devices, each HBT device having second interconnects and a collector and each collector having a respective second bonding pad bonded to a respective first bonding pad on the heat spreader, a first dielectric over the plurality of HBT devices and the plurality HEMT devices, a substrate, a plurality of CMOS devices having third interconnects formed on the substrate, a second dielectric over the CMOS devices, the second dielectric bonded to a second side of the heat spreader, and a plurality of vias and fourth interconnects for selectively electrically connecting first interconnects on HEMT devices, second interconnects on HBT devices, and third interconnects on CMOS devices.

In yet another embodiment disclosed herein, a three dimension three dimensional device with heterogeneous integration of diverse technologies comprises a heat spreader, a mixed technology integrated circuit coupled to a first side of the heat spreader, the mixed technology integrated circuit comprising HEMT and HBT circuits, a CMOS integrated circuit coupled to a second side of the heat spreader, a heat sink, a first heat pipe coupling the mixed technology integrated circuit to the heat sink, and a second heat pipe coupling the CMOS integrated circuit to the heat spreader.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 4 shows the assumed material conductivities, interface thermal resistances and device operating conditions used in thermal simulations in accordance with the present disclosure.

DETAILED DESCRIPTION

Figure 1A:
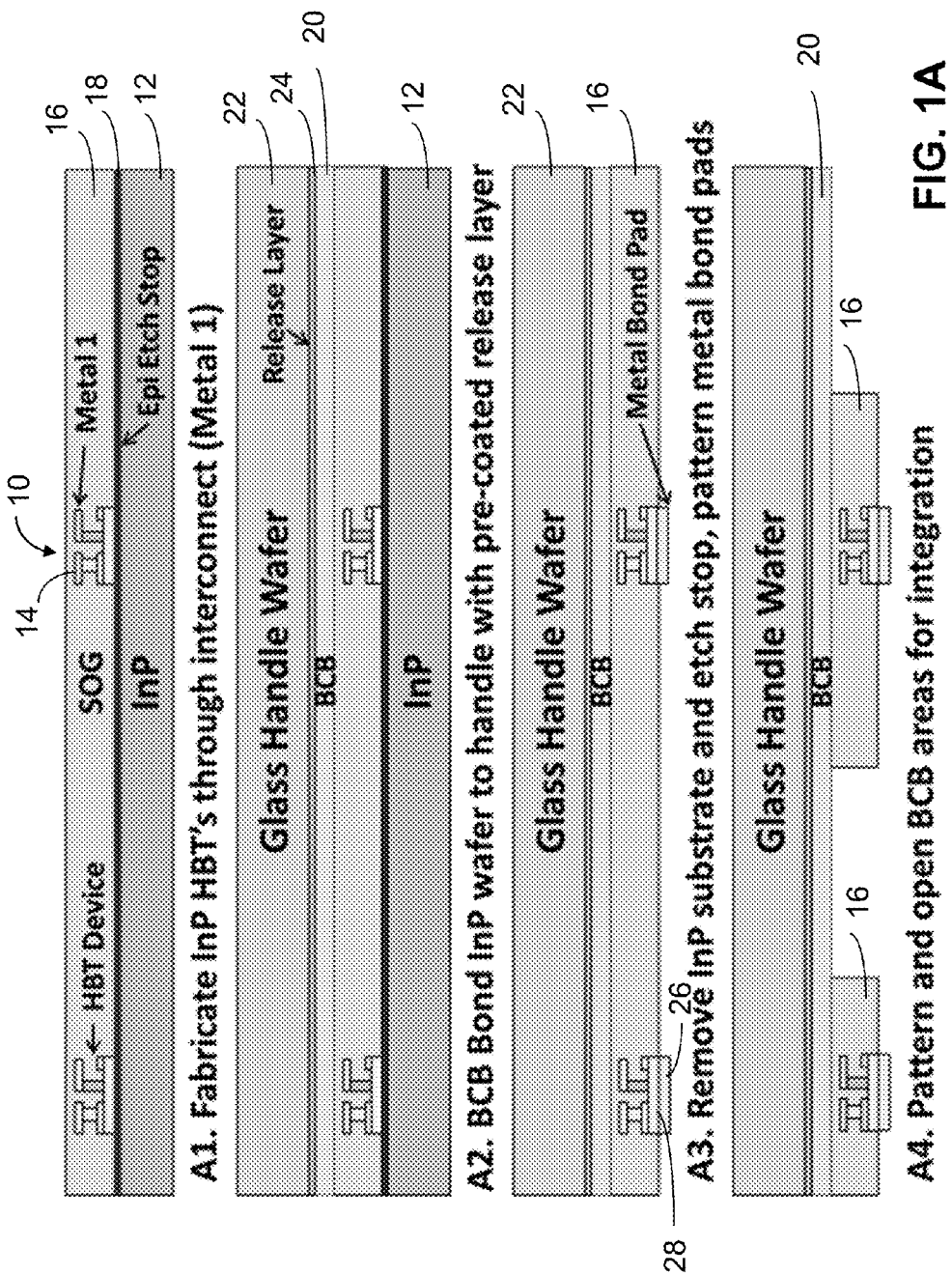
FIGS. 1A, 1B, 1C and 1D show a process flow for fabricating an integrable InP HBT device wafer and integrable GaN HEMT device wafer, and integration of HBT and HEMT wafers and CMOS in accordance with the present disclosure.

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The present disclosure describes a highly efficient heat spreader that can be used to provide thermal management and an integration platform for heterogeneous 3D device integration. Devices, including InP heterojunction bipolar transistors (HBTs), high electron mobility transistors (HEMTs), such as GaN HEMTs, and CMOS may be integrated. One embodiment uses a SiC sub-platform approach. GaN-related devices epitaxial layers may be grown on SiC and fabricated before further integration processing. Devices in other material systems may be either partially or fully fabricated on their native substrates and bonded onto a temporary holder. The native substrate may be then removed by mechanical and chemical abrasion fabrication processes to leave only a very thin device layer, which may be only a few um thick. This thin device layer may be then bonded onto a integration sub-platform by metal-metal bonding processes, dielectric layer bonding or epoxy bonding methods. After the bonding process, device fabrication process may resume and interconnects among the devices may be fabricated.

Locally generated heat at device junctions may be efficiently spread out by a highly thermally conductive sub-platform, as described further below, resulting in a reduced maximum device junction temperature. Heat pipes, which may be electrical interconnects, function to extract heat from the integration sub-platform to an external heat sink to further reduce device junction temperature. Devices that have 3D integration and use the present disclosure for thermal management, have lower thermal resistance to the external heat sink providing lower maximum device junction temperature, higher performance and improved reliability.

In the present disclosure a highly thermally conductive material, such as SiC or diamond or other highly thermally conductive substrate, is used as an integration sub-platform and a heat spreader. As discussed above this provides especially good thermal management for 3D integration of devices. The integration sub-platform may have a thickness of a few micrometers to a few hundred micrometers depending on processing requirements and the desired power handling capability. Other devices may be bonded to the integration sub-platform and preferably a low thermal resistance bonding method is used, such as metal-metal bonding. SiC and diamond each have an excellent thermal conductivity and mechanical strength. Therefore, SiC and diamond materials are good candidates for an integration sub-platform. Other devices may mounted to the integration sub-platform by conventional epi-transfer or chip bonding. The integration sub-platform acts as a heat spreader and quickly extracts heat from device hot points to one or more external heat sinks, effectively reducing thermal resistance.

InP HBTs, GaN HEMTs, InP HEMTs, GaAs HBTs, GaAs HEMTs and other semiconductor devices, including CMOS devices, may be fabricated independently by stopping a standard fabrication flow at a suitable step. Parallel fabrication shortens the overall heterogeneous interconnect fabrication cycle.

FIGS. 1A, 1B, 1C and 1D show a process flow for fabricating HBT devices, which may include InP and GaAs devices, and HEMTs devices, which may include GaN, InP and GaAs devices. FIGS. 2A, 2B and 2C show a process flow for integrating CMOS devices with the HBT and HEMT devices.

Figure 2A:
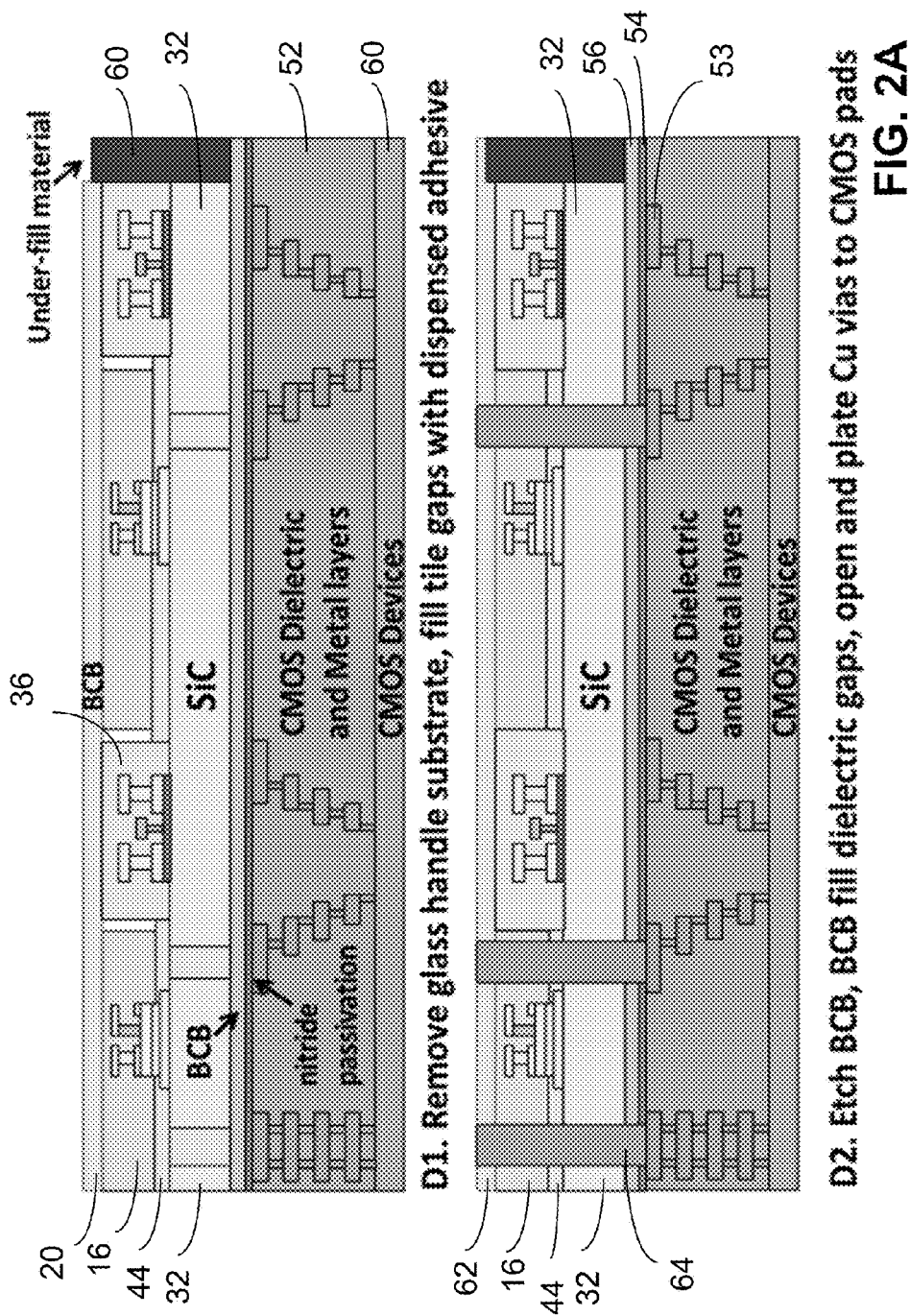
FIGS. 2A, 2B and 2C show a process flow for heterogeneous interconnect (HI) between three integrated technologies in accordance with the present disclosure.
Figure 2B:
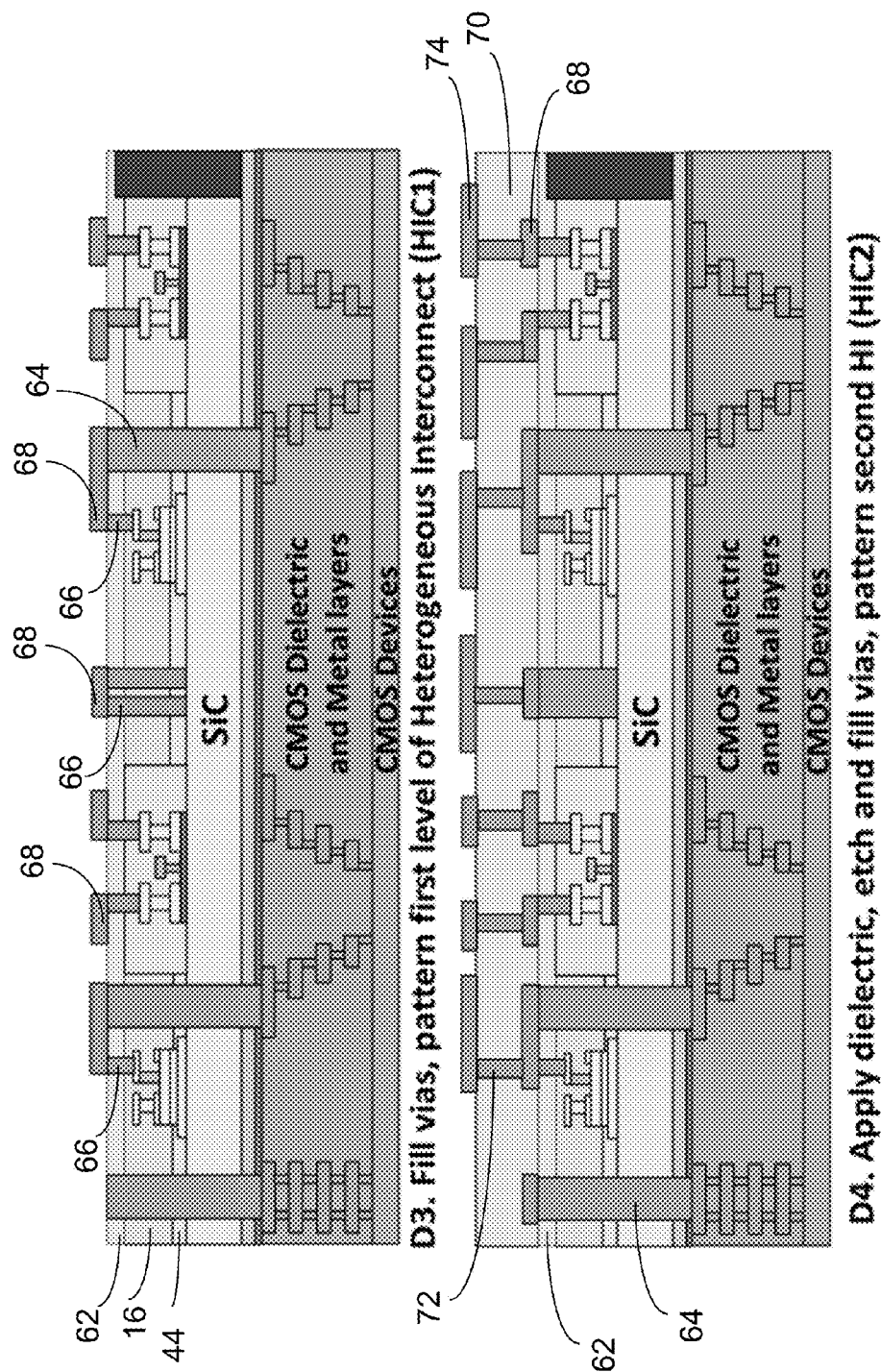
Figure 2C:
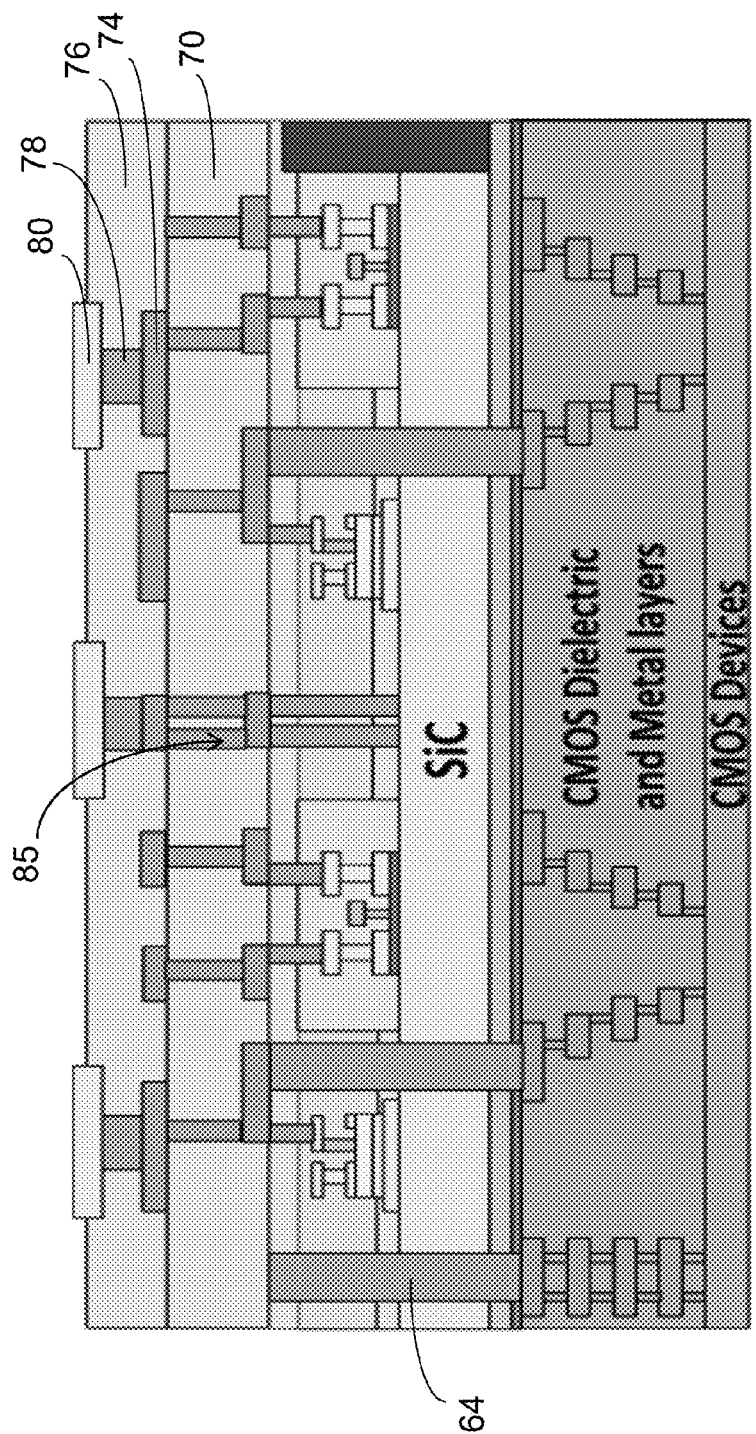

In steps A1 to A4, as shown in FIG. 1A, InP HBTs are formed. In step A1, HBTs 10, which may be double heterojunction bipolar transistors (DHBTs), are fabricated on an InP substrate 12 through the metal interconnect layer 14. All the electrodes are formed; however, the HBTs transistors are electrically isolated. A dielectric layer 16, which may be a spin-on glass (SOG) layer, may be used as an insulator. An epi etch stop layer 18 may be between the SOG layer 16 and the InP substrate 12. At this point, a pre-integration HBT yield may be measured.

In step A2, the InP device wafer is bonded with benzocyclobutene (BCB) 20 to a handle wafer 22, which may be about 700 μm thick. The handle wafer 22 may be pre-coated with a release layer 24, which may be a thin ultra violet (UV) release layer, or may be a temporary bonding adhesive. In one embodiment, the handle wafer 22 may be a SiC, diamond or borofloat glass, which may be 700 to 800 μm thick that has a thin, laser releasable, polymer (0.5 μm) release layer 24 preapplied and cured.

Then in step A3, the InP growth substrate 12 is removed by wet etching to the epi etch stop layer 18. Metal bond pads 26, which may be gold and function as a metallic sub-collector, are patterned on the collector 28 of the HBTs 10. After the InP growth substrate 12 is removed with wet etching, only the HBT device 10, metal 26 and a thin dielectric layer 16 remain. Next in step A4, the dielectric layer 16 is patterned and etched to remove inter-device areas.

Figure 1B:
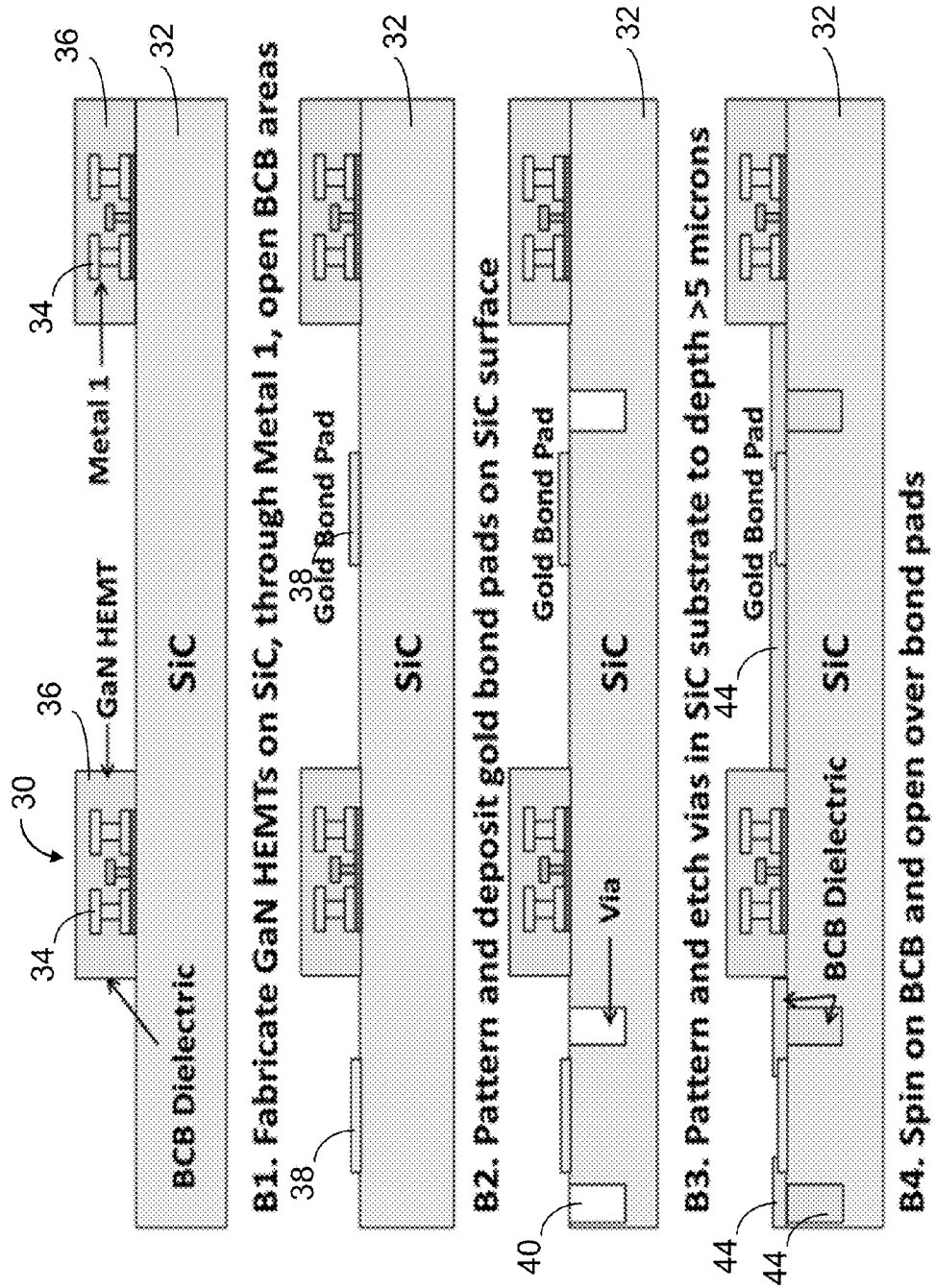

GaN HEMTs are formed in steps B1 to B4, as shown in FIG. 1B. In step 1B, GaN HEMTs 30 are fabricated on a growth substrate 32 through the metal interconnect layer 34. In the following, the growth substrate 32 is described as a SiC substrate 32; however the growth substrate may also be a diamond substrate or any other highly thermally conductive substrate. At this point, pre-integration GaN HEMT yield may be measured. A BCB dielectric 36 is then deposited over the HEMTs 30, patterned, and etched in the inter-device areas.

Figure 3:
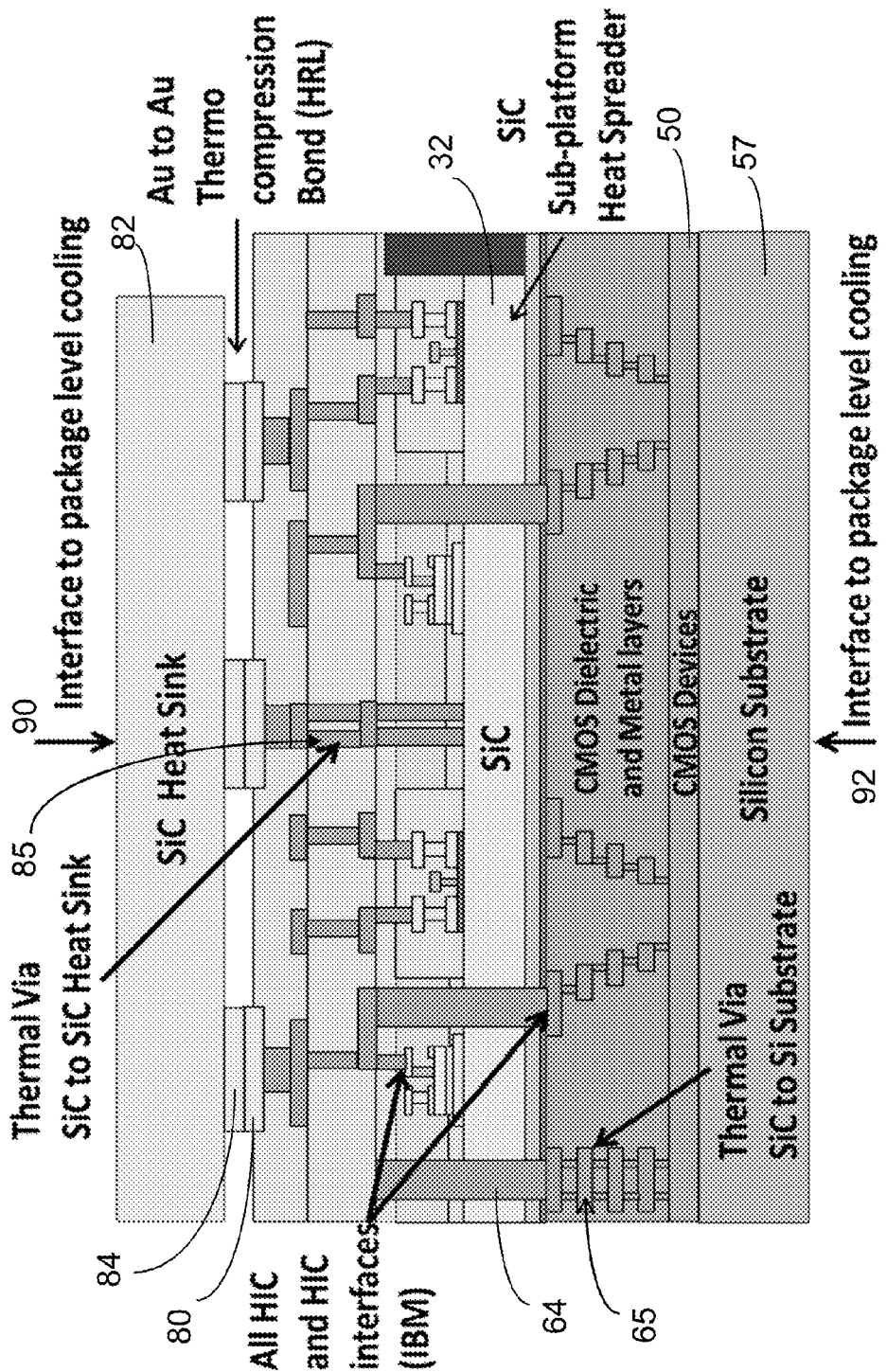
FIG. 3 shows an integrated 3D device with heat spreading and heat sinks in accordance with the present disclosure.

Then in step B2, lithographically defined metallic bonding pads 38 are deposited on the SiC substrate 32 for integrating with the InP HBTs 10. Next in step B3, vias 40 are patterned and dry etched in the SiC substrate 32 to a depth roughly 1 to 2 µm beyond a final target thickness of the SiC substrate 32, which may be about 5 µm. So the depth of via 40 may be as deep as 6 to 7 µm. The etching may be performed by a reactive ion etch (RIE). The pre-etched vias 40 are a portion of an interconnect via 64 between the GaN 30 and InP 30 devices to a CMOS layer, as shown in FIG. 3. Streets in the SiC substrate 32 for dicing may also be etched in step B3.

Next in step B4, a photo-definable BCB layer 44 is applied and patterned to the open areas on the perimeter of the gold bond pads 38, and also applied and patterned to fill vias 40. Use of the BCB on the perimeter of the gold bond facilitates precise bond alignment of the gold pads 26 on the InP device wafer with the gold pads 38 on the GaN device wafers.

Figure 1C:
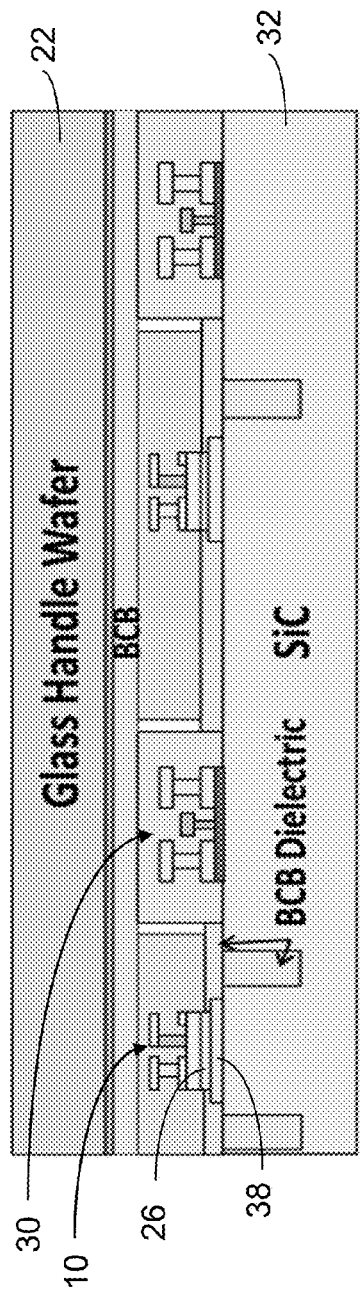
Figure 1C:
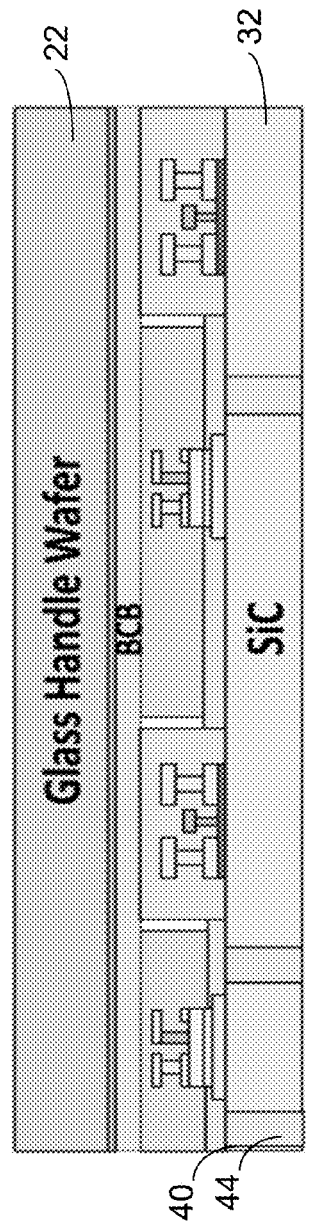

In steps C1 and C2 the InP HBT 10 and GaN HEMT 30 devices are integrated, as shown in FIG. 1C. In step C1 the InP 10 and GaN 30 device wafers are aligned and the gold pads 26 are bonded to the gold pads 38 using a thermo-compression bonding process. Heat removal from the HBT 10 is improved by this metal-bonding of the HBT collector directly to the electrically insulating SiC substrate 32. The InP and GaN wafers, which may be 75 mm or 100 mm wafers, may be bonded using a low-temperature (200° C.) Au-to-Au thermo-compression bonding process and may be performed using a FC-300 bonder.

Then in step C2, the SiC substrate 32 is thinned, polished and etched to a target thickness of 5 µm. The thinning may be performed by mechanical grinding and chemical-mechanical polishing. There is an inherent trade-off between the optimal thickness for heat spreading, in which a thicker SiC substrate is better, and the optimal thickness for monolithic integration into an IC process flow, in which a thicker SiC substrate is better. Thermal simulations suggest that a heat-spreader SiC substrate 32 thickness of 3-5 µm is sufficient to maintain target device junction temperature for reliable operation.

The multi-technology wafers of InP devices 10 and HEMT devices 30 may then be cut into tiles along the streets in the SiC substrate 32. At this point, a tile has a total thickness of about 760 µm, which includes a 700 to 800 µm thick handle wafer 22, a 5 µm thick SiC substrate 32, and the InP 10 and GaN 30 devices, which are about 3 to 5 µm thick.

Figure 1D:
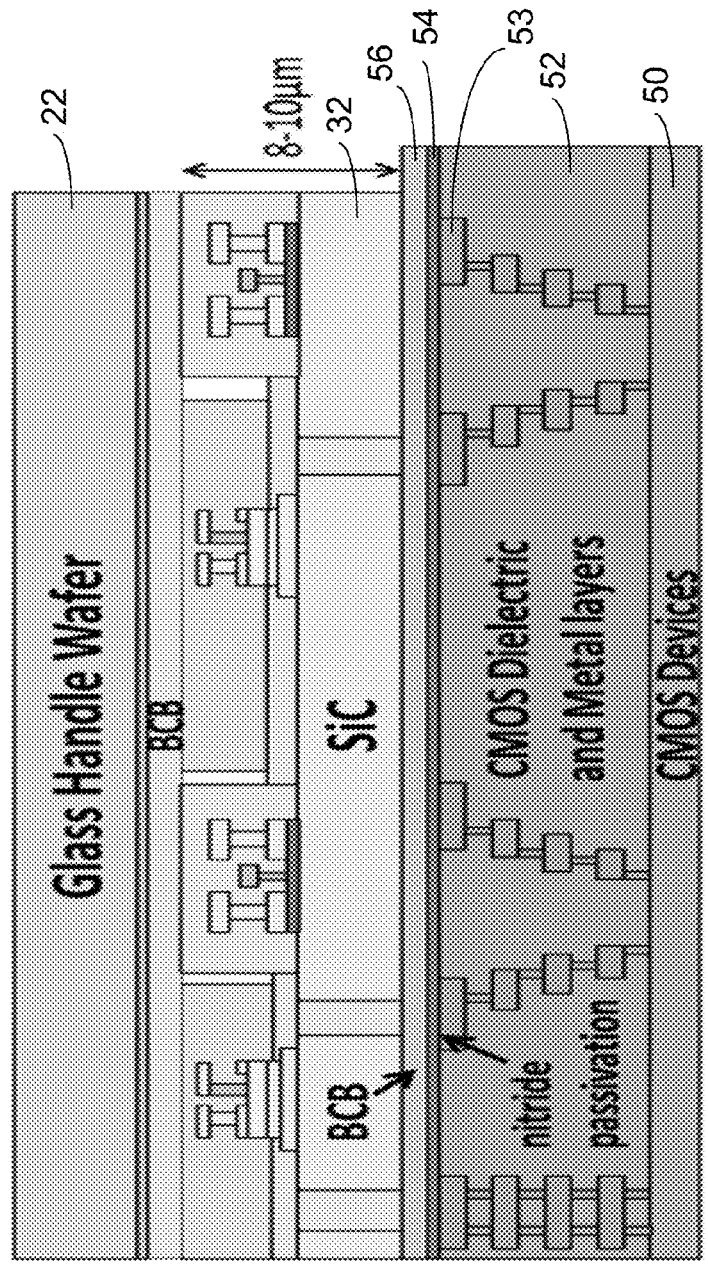

The multi-technology wafer or tiles of InP devices 10 and HEMT devices 30 may then be aligned to a CMOS wafer or tile, which has CMOS devices 50, dielectric 52 and via and metal layers 53 and a nitride passivation layer 54, as shown in step C3 in FIG. 1D, and then bonded to the CMOS wafer with a BCB layer 56, with the nitride passivation layer 54 in contact with the BCB layer 56. The CMOS wafer may be 200 mm in size, and have a silicon substrate 57, as shown in FIG. 3.

A process for heterogeneous interconnect is shown in FIGS. 2A to 2C, steps D1 to D5. In step D1, the heterogeneous interconnect (HI) sequence begins with removing the handle wafer 22 by using a laser release process to release a ultra violet (UV) release layer, or by using either a heat and slide method or a bonding polymer removal solvent soak to release a bonding adhesive, which releases the release layer 24 applied to the handle water 22 prior to bonding in step A2, shown in FIG. 1A. After the handle wafer 22 removal, an adhesive 60, which may be a wicking polymer, is selectively dispensed in the inter-tile areas and cured to planarize the tiles. Planarizing the deep trenches between the tiles is critical to heterogeneous integration (HI) lithography for uniform photo-resist coverage and pattern resolution.

Then in step D2, the BCB layer 22 is etched, and a new BCB planarization layer 62 is deposited. Deep vias 64 to the CMOS metal layers 52 are patterned and etched through the BCB layer 62, the dielectric layer 16, BCB layer 44, the SiC substrate 32, the BCB layer 56, and the nitride passivation layer 54. A liner/barrier, such as a dielectric for passivation, may then be deposited in the patterned vias and then the deep vias 64 are copper plated.

Next in step D3, vias 66 are patterned and etched through the BCB layer 62, the dielectric layer 16, and for some vias 66 through the BCB layer 44 to the SiC substrate 32 to form the metal 1 level interconnect for the InP and GaN devices. The via 66 etch may terminate on a titanium layer deposited on the gold interconnects 14 and 34 for the HBT 10 and HEMT 30 devices, respectively. Then a liner/barrier, such as a dielectric for passivation, may be deposited followed by copper plating to fill the vias 66 and to form the first level of heterogeneous metal interconnect 68.

In step D4, a second heterogeneous interconnect (HI2) may be added. A BCE planarization layer 70 is deposited. Vias 72 to the first level of heterogeneous metal interconnect 68 are patterned and etched through the BCB layer 70. A liner/barrier, such as a dielectric for passibation, may then be deposited in the patterned vias 72 followed by copper plating to fill the vias 72 and to form the second level of heterogeneous metal interconnect 74.

In step D5, a final dielectric layer 76 is applied, vias 78 etched, and terminal metal layers are plated to form copper plated vias 78 and plated gold pads 80. A plated barrier may be used between the copper and gold. The plated gold pads 80 form an interface to a high thermal conductivity heat sink 82 that may be a SiC heat sink and that may be patterned with metal bond pads 84 that are metal-to-metal bonded with thermal compression to the gold pads 80, as shown in FIG. 3. The heat sink 82 may also be a diamond material rather than SiC.

As shown in FIG. 2C, the combination of vias 66, first level of heterogeneous metal interconnect 68, vias 72, second level of heterogeneous metal interconnect 74, vias 78, gold pad 80 and gold pad 84 may form a heat pipe 85 from the SiC substrate 32 directly to the SiC or diamond heat sink 82.

The heat sink 82 may be formed by bonding a SiC wafer or diamond wafer to a carrier wafer for handling with a release layer, such as a temporary bonding material. The heat sink wafer 82 may then be diced into individual heat-sink dies as needed that are then bonded to the gold pads 80.

Alternatively, low temperature solders (e.g., Au—Sn or Au—In), may be used to bond the heat sink 82 to the gold pads 80.

As shown in FIG. 3, a heat pipe 65 may be formed coupling the CMOS devices 50 to the heat spreader, which is the SiC substrate 32. The heat pipe 65 may be formed by vias and metal layers 53.

The heat sink 82 may be coupled to or be an interface to package level cooling 90. Similarly, the Si substrate 57 may be coupled to or be an interface to package level cooling 92.

Thermal budgets have been simulated for reliable operation of the three-device technology HI chip consisting of GaN HEMTs and InP DHBTs on a CMOS/BiCMOS platform using maximum transistor layout densities at typical device power levels. The simulations have shown that the mean time to failure (MTTF) may be greater than $10^6$ hours.

FIG. 4 shows the assumed material conductivities, interface thermal resistances and device operating conditions used in the thermal simulations. While the peak device junction temperatures depend strongly on the package-level thermal management method applied at the top and bottom chip interfaces, the internal high-performance SiC/Copper conductive network effectively spreads and transfers heat within the chip.

An HI IC utilizing high thermal conductivity lateral spreaders, such as SiC substrate 32, and vertical thermal vias, including heat pipes 85 from the SiC substrate 32 to heat sink 82 and the interface to package level cooling 90 and the interface to package level cooling 92, as shown in FIG. 3, has lower maximum junction temperatures, which results in improved reliability. Dense integration of diverse technologies is provided for by intimate proximity of GaN HEMT and InP HBT junctions to the SiC substrate 32 that laterally spreads the heat and the Cu thermal vias that vertically remove heat to heat sinks. Simulation has shown that average power levels >150 W/cm$^2$ can be achieved.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . . "

What is claimed is:

1. A method of three dimensional heterogeneous integration comprising:
    forming heterojunction bipolar transistor (HBT) devices comprising:
        forming HBT devices on a first substrate, each HBT device having a collector;
        removing the first substrate;
        forming first bonding pads on each collector of the heterojunction bipolar transistor devices;
    forming high electron mobility transistor (HEMT) devices comprising:
        forming HEMT devices on a first side of a growth substrate, wherein the growth substrate comprises a thermally conductive substrate;
        forming second bonding pads on the first side of the growth substrate;
    aligning and bonding the first bonding pads to the second bonding pads;
    forming CMOS devices on a Si substrate;
    bonding the CMOS devices on the Si substrate to a second side of the growth substrate; and
    forming selectively interconnects between the HBT devices, the HEMT devices, and the CMOS devices by forming vias and first and second level metal interconnects.

2. The method of claim 1 further comprising:
    forming a heat sink for interfacing with package level cooling; and
    forming heat pipes from the first side of the growth substrate to the heat sink.

3. The method of claim 1 wherein forming the heterojunction bipolar transistor (HBT) devices comprises:
    forming HBT devices on the first substrate and forming first metal interconnects for each HBT device;
    forming a first dielectric layer over the HBT devices;
    bonding the first dielectric layer to a handle wafer coated with a release layer;
    removing the first substrate;
    forming the first bonding pads on each collector of the heterojunction bipolar transistor devices; and
    etching the first dielectric layer to remove areas between the HBT devices.

4. The method of claim 3 further comprising measuring pre-integration HBT device yield.

5. The method of claim 3 wherein:
    the handle wafer comprises SiC, diamond or borofloat glass.

6. The method of claim 3 wherein forming a high electron mobility transistor (HEMT) devices comprises:
    forming HEMT devices on the growth substrate;
    forming a second dielectric layer over the HEMT devices;
    etching the second dielectric layer to remove areas between the HEMT devices;
    forming the second bonding pads on the growth substrate;
    forming first vias in the growth substrate; and
    forming a third dielectric on open areas on perimeters of second bonding pads and filling the first vias with the third dielectric.

7. The method of claim 6 wherein:
    the HEMT devices comprise GaN, InP or GaAs; and
    the HBT devices comprise InP or GaAs.

8. The method of claim 6 further comprising:
measuring a pre-integration HEMT device yield.
9. The method of claim 6 wherein:
the first dielectric layer is bonded to the handle wafer with benzocyclobutene (BCB); and
the second, and third dielectrics comprise BCB.
10. The method of claim 6 wherein:
bonding the CMOS devices on the Si substrate to the growth substrate comprises bonding with a fourth benzocyclobutene (BCB) layer.
11. The method of claim 1 wherein:
aligning and bonding the first bonding pads to the second bonding pads comprises thermal compression.
12. The method of claim 6 further comprising:
removing the handle wafer;
forming a planarized benzocyclobutene (BCB) layer over the first and second dielectric layers to ensure uniform photo-resist coverage and pattern resolution for heterogeneous integration (HI) lithography; and
forming selectively interconnects between the HBT devices, the HEMT devices, and the CMOS devices comprising vias and first and second level metal; and
forming vertical heat pipes comprising filled vias connected to the growth substrate.
13. A three dimensional device with heterogeneous integration of diverse technologies comprising:
a heat spreader;
a plurality of high electron mobility transistor (HEMT) devices formed on a first side of the heat spreader, each HEMT having first interconnects;
a plurality of first bonding pads on the first side of the heat spreader;
a plurality of HBT devices, each HBT device having second interconnects and a collector and each collector having a respective second bonding pad bonded to a respective first bonding pad on the heat spreader;
a first dielectric over the plurality of HBT devices and the plurality HEMT devices;
a substrate;
a plurality of CMOS devices having third interconnects formed on the substrate;
a second dielectric over the CMOS devices, the second dielectric bonded to a second side of the heat spreader; and
a plurality of vias and fourth interconnects for selectively electrically connecting first interconnects on HEMT devices, second interconnects on HBT devices, and third interconnects on CMOS devices.

14. The three dimensional device of claim 13 wherein:
the heat spreader comprises a thermally conductive substrate.
15. The three dimensional device of claim 13 wherein:
the first and second dielectric comprise benzocyclobutene and are planar.
16. The three dimensional device of claim 13 further comprising:
a heat sink for interfacing with package level cooling; and
a first heat pipe coupled to the first side of the heat spreader and coupled to the heat sink.
17. The three dimensional device of claim 16 wherein the first heat pipe comprises vias comprising Cu.
18. The three dimensional device of claim 16 wherein the heat sink comprises SiC.
19. The three dimensional device of claim 13 wherein:
the HEMT devices comprise GaN, InP or GaAs; and
the HBT devices comprise InP or GaAs.
20. The three dimensional device of claim 16 further comprising:
a second heat pipe coupled to the substrate and coupled to the heat spreader.
21. The three dimensional device of claim 16 wherein:
the second heat pipe comprises vias comprising Cu.
22. The three dimensional device of claim 13 wherein the substrate comprises Si.
23. A three dimensional device with heterogeneous integration of diverse technologies comprising:
a heat spreader;
a mixed technology integrated circuit coupled to a first side of the heat spreader, the mixed technology integrated circuit comprising HEMT and HBT circuits;
a CMOS integrated circuit coupled to a second side of the heat spreader;
a heat sink;
a first heat pipe coupling the mixed technology integrated circuit to the heat sink; and
a second heat pipe coupling the CMOS integrated circuit to the heat spreader.
24. The method of claim 1 where the thermally conductive substrate comprises SiC or diamond material.
25. The method of claim 6 further comprising:
thinning the growth substrate so that first vias extend through the growth substrate.
26. The three dimensional device of claim 14 wherein:
the thermally conductive substrate comprises SiC or diamond material.

* * * * *